US012610596B2

(12) United States Patent
Dalcanale et al.

(10) Patent No.: US 12,610,596 B2
(45) Date of Patent: Apr. 21, 2026

(54) LATERAL POWER SEMICONDUCTOR DEVICE

(71) Applicant: NEXPERIA B.V., Nijmegen (NL)

(72) Inventors: Stefano Dalcanale, Nijmegen (NL); Adam Brown, Nijmegen (NL); Jim Parkin, Nijmegen (NL)

(73) Assignee: Nexperia BV, Nijmegen (NL)

( * ) Notice: Subject to any disclaimer, the term of this patent is extended or adjusted under 35 U.S.C. 154(b) by 576 days.

(21) Appl. No.: 18/062,700

(22) Filed: Dec. 7, 2022

(65) Prior Publication Data

US 2023/0178592 A1 Jun. 8, 2023

(30) Foreign Application Priority Data

Dec. 7, 2021 (EP) .................................... 21212785

(51) Int. Cl.
| | |
|---|---|
| *H10D 62/10* | (2025.01) |
| *H01L 25/07* | (2006.01) |
| *H10D 30/01* | (2025.01) |
| *H10D 30/47* | (2025.01) |
| *H10D 62/13* | (2025.01) |
| *H10D 62/85* | (2025.01) |
| *H10D 64/23* | (2025.01) |

(52) U.S. Cl.
CPC ......... *H10D 62/113* (2025.01); *H01L 25/074* (2013.01); *H10D 30/015* (2025.01); *H10D 30/47* (2025.01); *H10D 62/149* (2025.01); *H10D 62/8503* (2025.01); *H10D 64/254* (2025.01)

(58) Field of Classification Search
CPC .. H10D 62/149; H10D 64/254; H10D 64/257; H10D 64/251; H10D 30/47–485; H10D 30/015; H10D 62/113; H01L 23/4824
See application file for complete search history.

(56) References Cited

U.S. PATENT DOCUMENTS

| | | |
|---|---|---|
| 2010/0109052 A1 | 5/2010 | Nakajima et al. |
| 2012/0313147 A1 | 12/2012 | Anderson et al. |
| 2023/0075505 A1* | 3/2023 | Radulescu ............ H01L 23/481 |
| 2023/0386978 A1* | 11/2023 | Kuroda ............... H01L 23/4952 |

OTHER PUBLICATIONS

Extended European Search Report for corresponding European application EP21212785.6, 7 pages dated Jun. 20, 2022.

* cited by examiner

*Primary Examiner* — Wasiul Haider
(74) *Attorney, Agent, or Firm* — Ruggiero McAllister & McMahon LLC

(57) ABSTRACT

A lateral power semiconductor device is provided. Some semiconductor devices show signs of failure caused by a short between metal layers, which have showed cracks in the insulator layer between the two metals which causes the short-circuit. Removing the superimposition between the borders of the metal layers reduces the risk of cracks in the insulator layer and thereby increases the reliability of the device. The lateral power semiconductor device of the present disclosure has one of these metal layers configured so that the metal has been removed at the area where it superimposes the area of the other metal layer so that these are isolated from each other not only by the insulation layer in between these metal layers, but also by the fact that they are isolated by a lateral spacing so that they do not lie on top of each other.

18 Claims, 5 Drawing Sheets

101

102

103
103

104
104

105

201

202

203
203

204
204

205a　　205b　　205c　　205d

206

202

203
203

204
204

205a     205b     205c     205d

206

2-Die FET (Cascode)

Depletion-mode
GaN HEMT

D

G

SI
MOSFET

S

301

302 — Provide substrate

303 — Form first metal layer M1

304 — Form insulator layer

305 — Form second metal layer M2

306 — Form insulator layer

307 — Form third metal layer M3

LATERAL POWER SEMICONDUCTOR DEVICE

CROSS REFERENCE TO RELATED APPLICATION

This application claims the benefit under 35 U.S.C. § 119(a) of European Application No. 21212785.6 filed Dec. 7, 2021, the contents of which are incorporated by reference herein in their entirety.

BACKGROUND OF THE DISCLOSURE

1. Field of the Disclosure

The present disclosure relates to a lateral power semiconductor device and a method of manufacturing such a lateral power semiconductor device.

2. Description of the Related Art

Lateral power semiconductor devices are typically used as electronically controlled power switches. The gate, source and drain of the semiconductor are typically connected in the package by use of wire-bonding or clip-bonding. Especially for high power semiconductors such a High-Electron Mobility Transistor, HEMT, devices, clip-bonding has advantages over the wire-bonding. The combination of high switching speeds and high power require contacts with low electrical resistance and inductance to optimise electrical performance. Clip-bonding can meet these requirements, as the switching losses and inductance of the circuit is reduced.

Clip-bonded packaging may conventionally comprise high-lead solder to connect the clip to the pads as high-lead solder has a high thermal conductivity, good reliability and high bonding strength. For environmental reasons, lead-free bonding is a suitable alternative and may comprise high thermal conductivity adhesives. The bonding clips may be comprised of copper which is soldered in a single operation to the gate and the source; such copper clips have improved electrical and thermal characteristics as well as an increased reliability.

Although clip-bonding of lateral power semiconductor devices may have several advantages over wire-bonded alternatives, there are also some drawbacks. It has been found that clip-bonded packaging of power semiconductor devices such as HEMT devices, may demonstrate thermo-mechanical stress during the assembly process. This may result in cracks in the insulator layers which isolate metal layers. When such cracks in the insulator arise, this may cause failure of the semiconductor devices, especially in regions of high electrical stress.

Accordingly, there is a need to improve the reliability of such lateral power semiconductor devices, and more particularly, to reduce the risk for cracks in the insulator layers thereof, especially in the regions of high electrical stress.

SUMMARY

According to a first aspect of the present disclosure, the lateral power semiconductor device, comprises:
  a source pad area formed in a metal layer of the device;
  a drain pad area, spaced apart from said source pad and formed in said metal layer of the device;
  a plurality conductive fingers formed in a further metal layer of the device, and comprising:

a plurality of parallel source fingers coupled to and extending from said source pad area towards and underneath said drain pad area, and a plurality of parallel drain fingers isolated from said plurality of source fingers, and coupled to and extending from said drain pad area towards and underneath said source pad area, wherein said drain fingers are interdigitated between said source fingers; and wherein said drain pad area comprises a plurality of drain pads, one for each of said plurality of drain fingers, wherein said plurality of drain pads are isolated from each other by a spacing corresponding to the position of said source fingers extending underneath said drain pad area.

The inventors found out that certain lateral power semiconductor devices showed signs of failure which is caused by a short between metal layers. Investigated failed devices have showed cracks in the insulator layer between the two metals which causes the short-circuit. Further investigation demonstrated that these cracks could be localized in a specific region where the border of one metal layer crosses the border of another metal layer. Evidence of these cracks in top insulators between these two layers had been found, which are considered a likely cause of the failure of the device, or at least an indication of high mechanical stress in the structure may reduce the reliability of the device.

This problem occurred mostly in lateral semiconductor devices with clip-bonded dies. The thermo-mechanical stress induced by the assembly process or the package itself during high temperature, high voltage, causes electrical stress in the insulator layer between two metal layers.

It has been an insight of the inventors that removing the superimposition between the borders of the second metal layer and the third metal layer reduces the risk of cracks in the insulator layer and thereby increases the reliability of the device.

Accordingly, the lateral power semiconductor device of the present disclosure has one of these metal layers configured in such a way that the (second) metal has been removed at the area where it superimposes the area of the other (third) metal layer such that these are isolated from each other not only by the insulation layer in between these metal layers, but also by the fact that the isolated by a lateral spacing such that they do not lie on top of each other. Because of this design, the risk from cracks in this area is reduced.

In accordance with the present disclosure, the lateral power semiconductor device has at least a source pad area, a drain pad area and a plurality of conductive fingers. These parallel fingers comprise of a group of parallel source fingers or channels which are coupled to and extend from the source pad, and a group of parallel drain fingers or channels which are coupled to and extend from the drain pad. These source and drain fingers are interdigitated. The source pad area and drain pad area are formed in the third metal layer whereas the parallel fingers are formed in the second metal layer of the device. Some of these parallel fingers, in particular the parallel source fingers, extend underneath the drain pad area. Conventional designs have a single drain pad formed in the drain pad area, which thus superimposes part of the source fingers where the cracks may occur. The design of the present disclosure has its drain pad area split into a plurality of drain pads, one for each corresponding drain finger. As such, the metal of the drain pad area, i.e. the third metal layer, has been removed at the position of the source fingers of the below metal layer, i.e. the second metal layer. Accordingly, each of these drain pads being formed in the third metal layer is isolated from each other by a spacing which corresponds to the position of the source fingers extending underneath the drain pad area.

In an example, the semiconductor device further comprising an insulator layer covering a perimeter edge of each of said drain pads.

In an example, the semiconductor device further comprising contact pads corresponding in size to said drain pads, and wherein each of said contact pads in particular cover an area of said drain pad enclosed by an insulator layer on a perimeter edge of said respective drain pad.

In an example, the lateral power semiconductor device is high electron mobility transistor, HEMT device.

In an example, the lateral power semiconductor device further comprises:

a III-V layer comprising a semiconductor circuitry, said III-V layer in particular being a GaN layer.

One of the preferred embodiments of the present disclosure is a high power semiconductor device which comprises a semiconductor package with a high electron mobility transistor, HEMT, or field effect transistor, FET. The FET or HEMT is preferably a III-V and more preferably a GaN type FET or HEMT semiconductor.

In an example, the plurality conductive fingers are formed by a second conductive layer, said further conductive layer being arranged on top of said III-V layer, and isolated by an insulator layer in between said second conductive layer and said III-V layer.

In an example, the source pad area and said drain pad area, are formed by a third conductive layer, said third conductive layer being arranged on top of said second conductive layer, and isolated by an insulator layer in between said third conductive layer and said second conductive layer.

In an example, each of said drain pads further comprises a drain contact pad arranged on top of a corresponding drain pad and wherein said drain pads and said drain contact pads are isolated by an insulator layer in between said drain pads and said drain contact pads, wherein said drain contact pads are preferably comprised of palladium covered metal layer.

In an example, the source pad area and said drain pads are coupled to said plurality of conductive fingers by a plurality of corresponding vias.

In an example, each of said plurality of parallel drain fingers are interconnected by a common drain bus bar, wherein said common drain bus bar is preferably formed in said metal layer.

The design according to the first aspect of the present disclosure demonstrates increased reliability and performance. The bus bar improves the accuracy of the measured $R_{on}$ during on-wafer test, which common drain bus bar is formed in the metal layer of the plurality of fingers. As the drain pads are isolated from each other, each individual drain pad will have a higher $R_{on}$ as compared to the conventional design in which a single drain pad covers the whole drain pad area. By interconnecting each of the drain fingers with a common drain bus bar, which is preferably formed in the same metal layer of the fingers, the accuracy of the measured $R_{on}$ is improved thereby.

In an example, one or more of said source pad area and said drain pad area are arranged for clip bonding packaging of said semiconductor device.

In a second aspect, there is provided a cascoded semiconductor package comprising a Silicon MOSFET arranged on top of a GaN HEMT according with the first aspect or any of the examples thereof.

For a cascoded device where a Si MOSFET works together with a GaN HEMT it is preferred to place the MOSFET on top of the HEMT. This way the parasitic inductance of the midnode is minimal and the performance of the cascode during switching operation is optimized.

In a third aspect, there is provided method of manufacturing a lateral power semiconductor device, said method comprising the steps of:

providing a semiconductor substrate, and forming semiconductor device thereon;

forming a first metal layer (M1);

forming an insulator layer on said first metal layer;

forming a second metal layer (M2) on said insulator layer, said second metal layer comprising a plurality of conductive fingers, said conductive fingers comprising a plurality of parallel source fingers and parallel drain fingers isolated from said source fingers, wherein said drain fingers are interdigitated between said source fingers;

forming an insulator layer on of said second metal layer;

forming a plurality of vias between said second metal layer (M2) and a third metal layer (M3), through said insulator layer;

forming a said metal layer (M3) on said insulator layer, said third metal layer comprising a source pad area and a drain pad area;

and wherein said drain pad area comprises a plurality of drain pads, one for each of said plurality of drain fingers, wherein said plurality of drain pads are isolated from each other by a spacing corresponding to the position of said source fingers extending underneath said drain pad area.

BRIEF DESCRIPTION OF THE DRAWINGS

The disclosure will now be described in a non-limiting way with reference to the accompanying drawings in which like parts are indicated by like reference symbols and which drawing show in.

DETAILED DESCRIPTION

Figure 1:
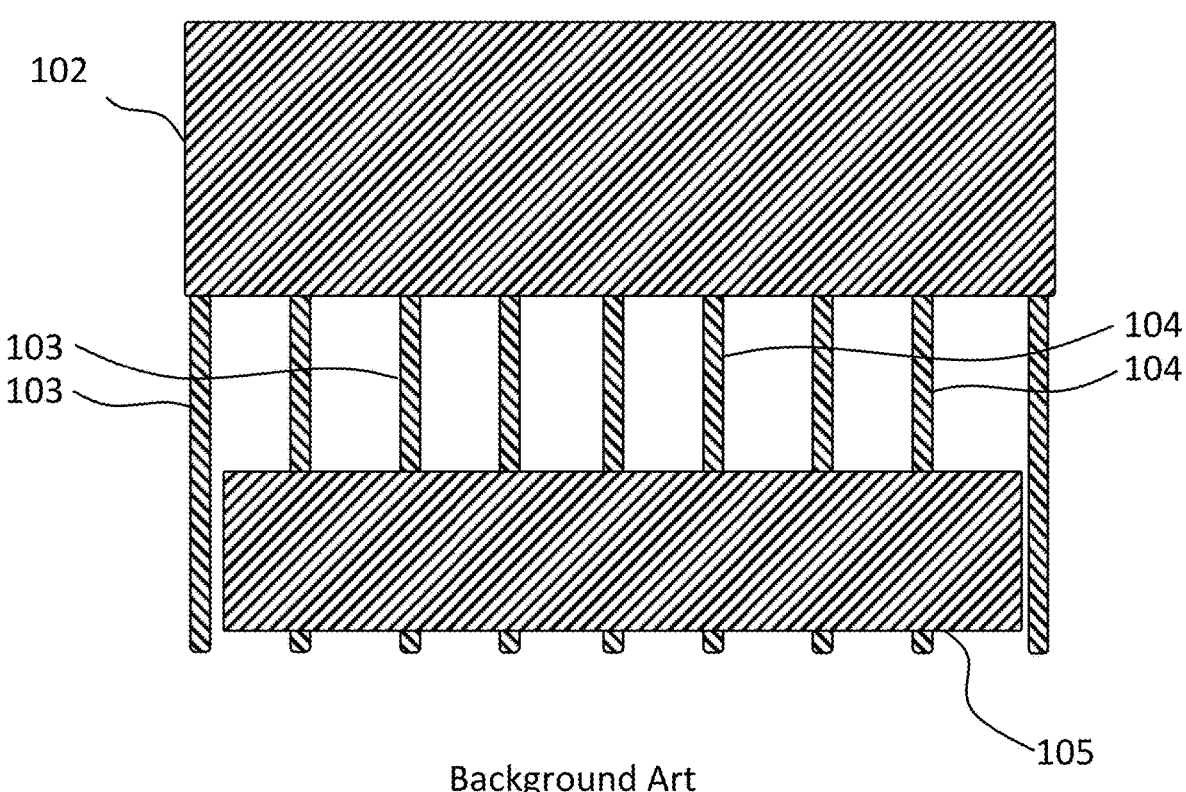
FIG. 1 shows a top view of the metal layers comprising the source pad, drain pad and conductive fingers of a lateral power semiconductor in accordance with the prior art.

It is noted that in the description of the figures, same reference numerals refer to the same or similar components performing a same or essentially similar function.

A more detailed description is made with reference to particular examples, some of which are illustrated in the appended drawings, such that the manner in which the features of the present disclosure may be understood in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

In the description below, the present disclosure is being discussed with respect to a lateral power semiconductor device or die, for example a Field Effect Transistor, FET, or preferably a High-Electron-Mobility Transistor, HEMT. As such, three terminals are present on the semiconductor die—a gate terminal, a source terminal and a drain terminal. The gate terminal is used for providing a voltage to the semiconductor die. The semiconductor die is arranged to support a relatively large current between the drain terminal and the source terminal.

Particularly for clip bonded packaging but to a certain extent also for wire-bonded packaging, lateral power semiconductor devices experience different levels of thermomechanical stress which is induced by the assembly process or the packaging itself during high temperature, high voltage stress in an insulator layer between two metal layers of the lateral semiconductor device when a high difference in voltage potential is applied between these metal layers. Such high voltage potential is typical for power FETs or HEMTs and causes failure in a specific region where the border of one metal layer crosses the border of the other metal layer. Evidence has been found that cracks in the top insulator between these two metal layers is the cause of the failure and an indication of high mechanical stress in the structure.

FIG. 1 discloses a top view of a lateral power semiconductor die or device 101 in accordance with the prior art. The device 101 comprises a source pad 102, a drain pad 105 and a plurality of conductive fingers 103, 104.

The plurality of conductive fingers 103 and 104 comprise both a plurality of drain fingers 104, and a plurality of source fingers 103. The plurality of parallel drain fingers 104 is isolated from the plurality of source fingers 103 and has an interdigitated design. The conductive source fingers 103 and conductive drain fingers 104 are formed in the same metal layer known as metal layer M2. The source fingers 103 in metal layer M2 are coupled to the source pad 102 in metal layer M3 through a plurality of vias (not shown). The drain fingers 104 in metal layer M2 are similarly coupled to the drain pad 105 in metal layer M2 through a different set of vias (also not shown).

The design shown in FIG. 1 demonstrates relative high failure rates, especially in high-voltage, high-temperature applications comprising devices with power FETs and/or HEMTs. In the area of the design where the border of metal layer M2 crosses the metal layer M3, cracks appear in the insulator between these layers. These cracks result in failure of the device and thus negatively affect the failure rates. The area where both metal layers M2 of the fingers 103, 104 and metal layer M3 of the pad area's 102 and 105 cross is where the parallel conductive source fingers 103 extend underneath the drain pad area 105. In the design shown in FIG. 1 the drain pad is formed by a rectangular area 105 which also covers part the source fingers, at this superimposed area evidence has been found of occurring cracks.

Following the above, different from the prior art design as shown in FIGS. 1, the drain pad area of the design shown in FIGS. 2A-2D has been redesigned to demonstrate not one single drain pad 105, but a plurality of individual drain pads 205a, 205b, 205c, 205d.

Figure 2A:
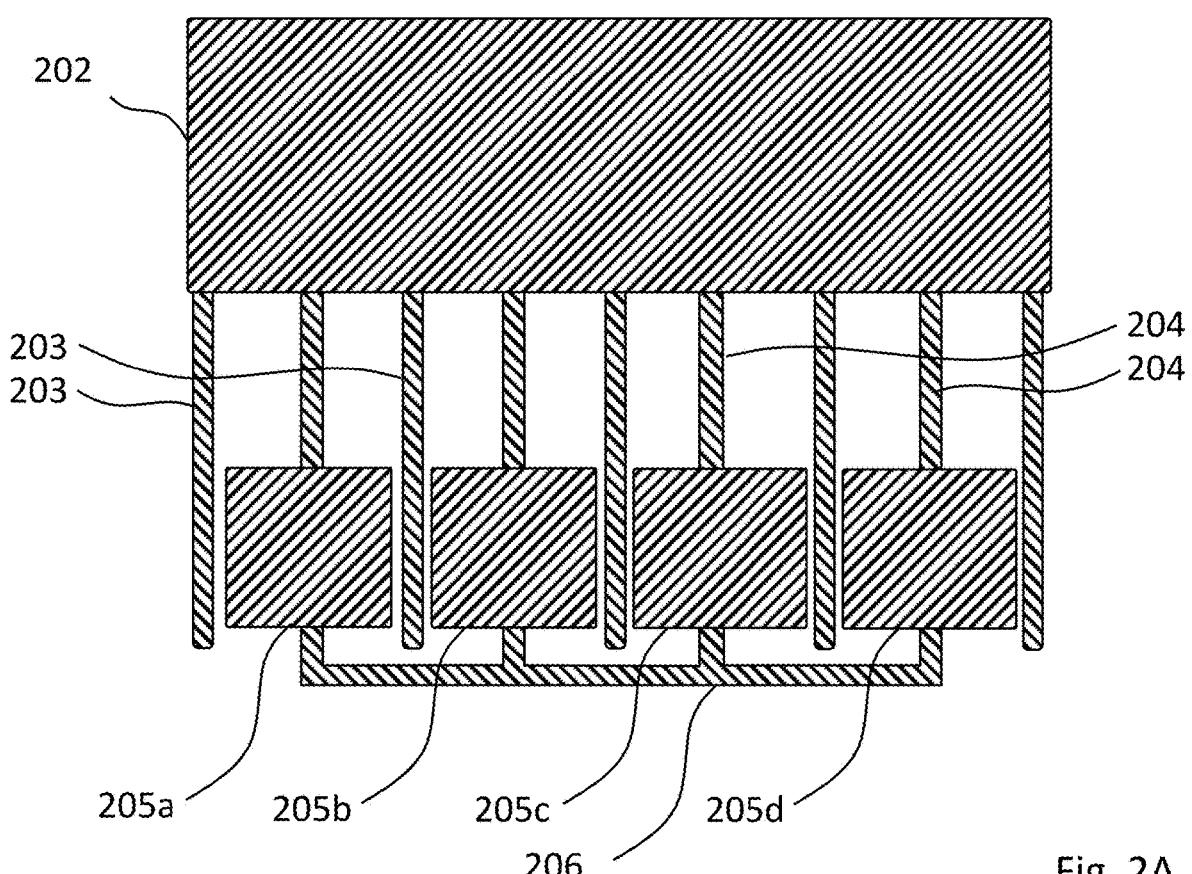
FIG. 2A shows a top view of the metal layers comprising the source pad, drain pad and conductive fingers of a lateral power semiconductor in accordance with an aspect of the present disclosure.
Figure 2B:
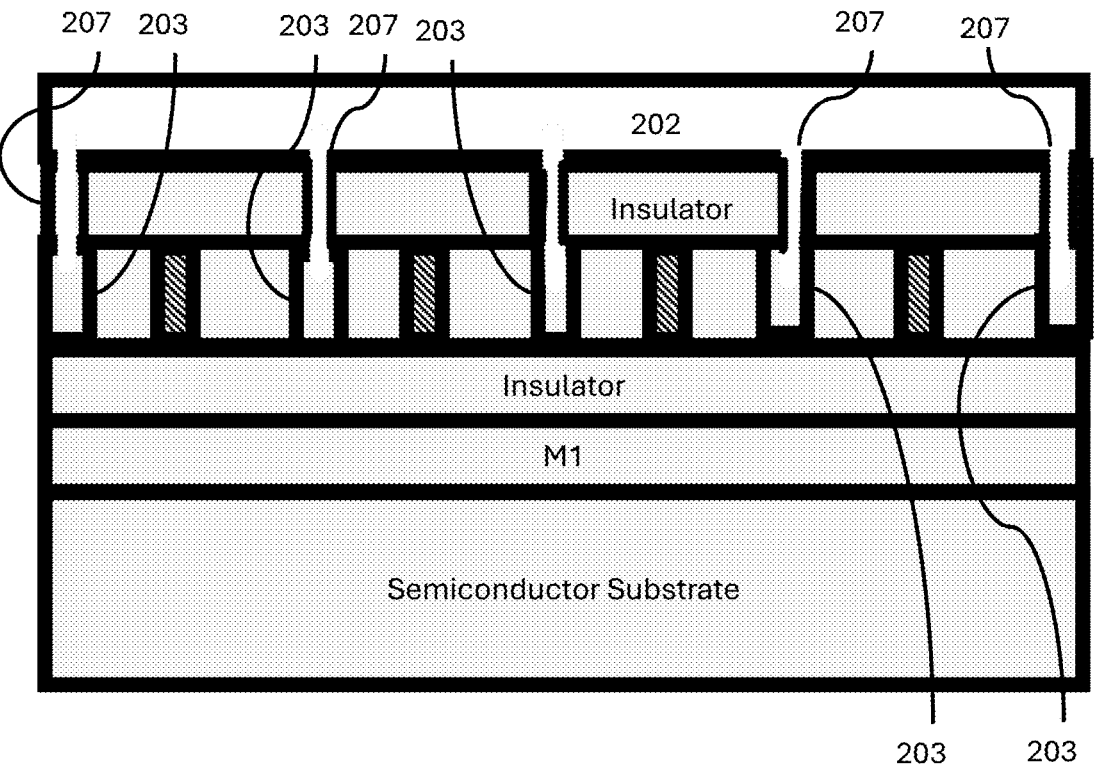
FIGS. 2B-2C show a side view of the semiconductor including the metal layers comprising the source pad, drain pad and conductive fingers of a lateral power semiconductor.
Figure 2C:
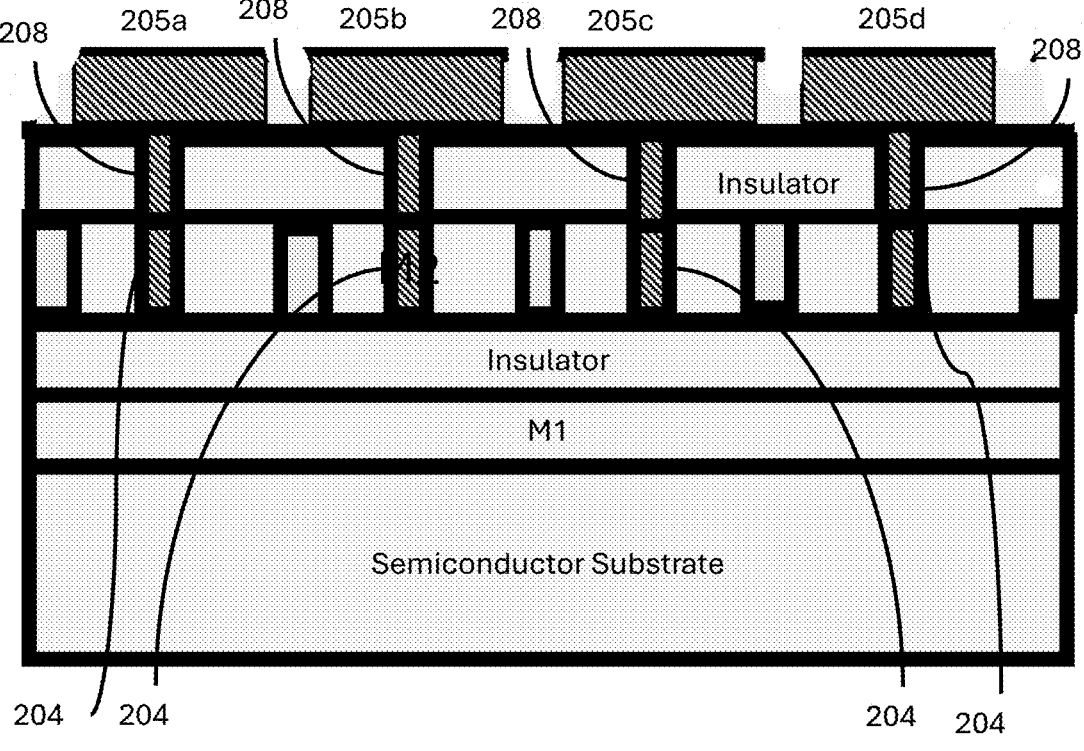
Figure 2D:
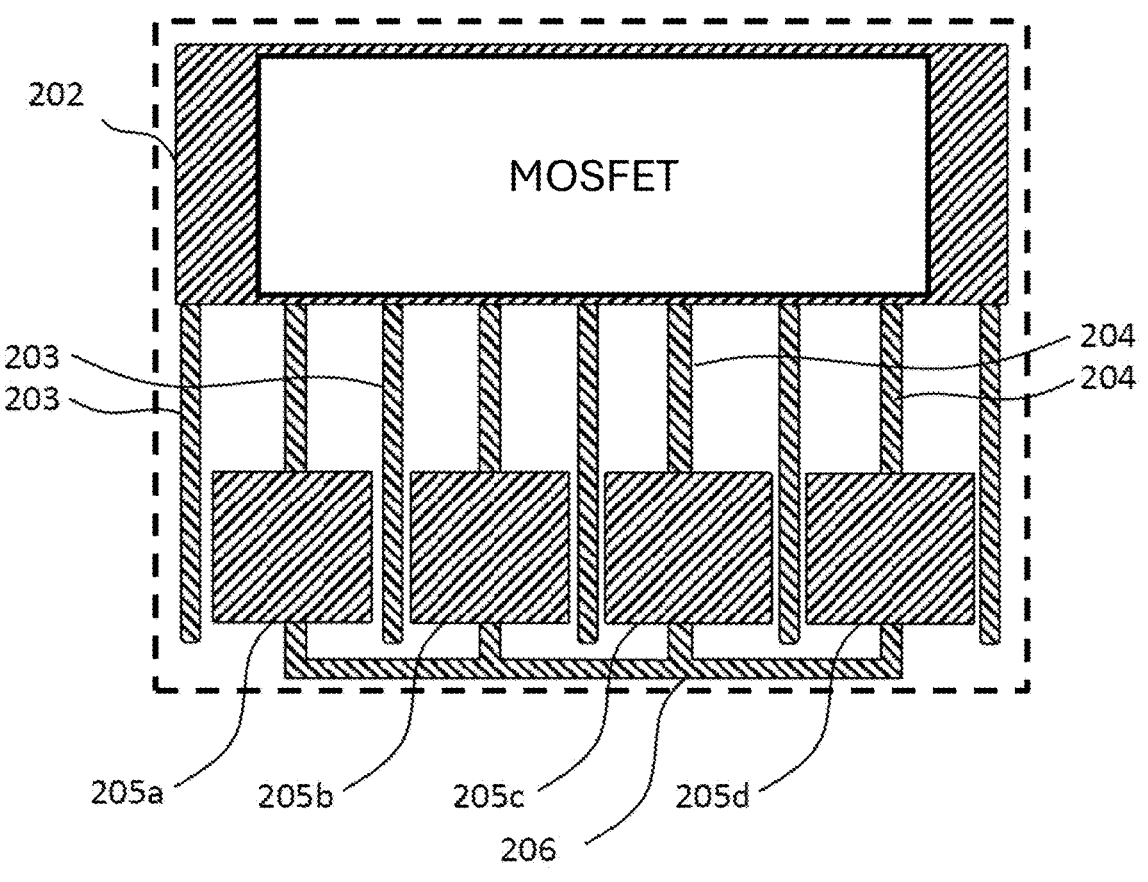
FIG. 2D shows a top view of the semiconductor including the metal layers comprising the source pad, drain pad and conductive fingers of a lateral power semiconductor implemented for a cascoded semiconductor package comprising a Silicon MOSFET arranged on top of a GaN HEMT.
Figure 2D:
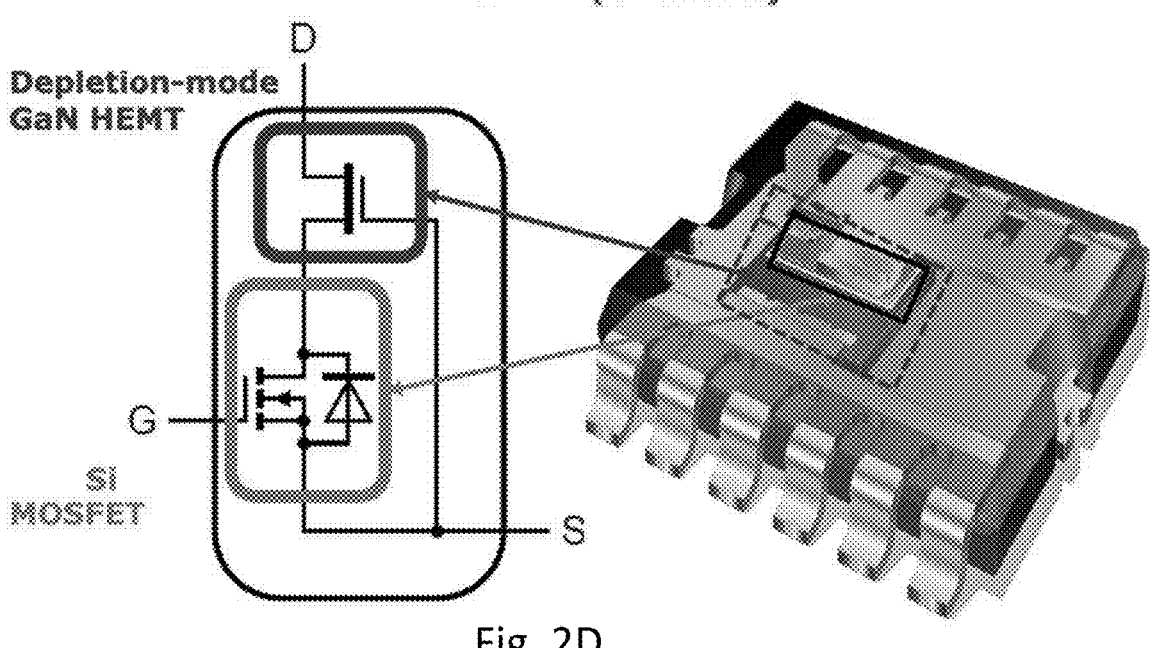

The design 201 shown in FIGS. 2-2D has some similarities with the design of FIG. 1 as it also shows a source pad area 202, in which source pad is formed, which source pad consists of a single continuous or consecutive pad. The design 201 also shows a plurality of conductive fingers 203 and 204 comprise both a plurality of drain fingers 204, and a plurality of source fingers 203. The plurality of parallel drain fingers 204 are isolated from the plurality of source fingers 203 and have an interdigitated design. The conductive source fingers 203 and conductive drain fingers 204 are formed in the same metal layer known as metal layer M2. The source fingers 203 in metal layer M2 are coupled to the source pad 202 in metal layer M3 trough a plurality of vias 207. The drain fingers 204 in metal layer M2 are similarly coupled to the drain pad 205 in metal layer M2 through a different set of vias 208.

In another example, at the source end, the source pad area may consist of a plurality of individual source pads (not shown), similar to the structure of the plurality of isolated drain pads 205a, 205b, 205c, 205d, as demonstrated in the structure shown in FIGS. 2A-2D. In yet another example, one of the source pad area or drain pad area may consist of a plurality of individual source pads or drain pads respectively, or may comprise both a plurality of individual source pads at the source end, and a plurality of individual drain pads at the drain end.

The design 201 shown in FIG. 2A and FIGS. 2C-2D, has its drain pad area split into a plurality of drain pads 205a, 205b, 205c, 205d, one for each corresponding drain finger 204. As such, the metal of the drain pad area, i.e. the third metal layer M3, has been removed or is simply not present at the position of the source fingers 203 of the below metal layer M2. Accordingly, each of these drain pads 205a, 205b, 205c, 205d, being formed in the third metal layer M3 is isolated from each other by a spacing which corresponds to the position of the source fingers 203 extending underneath the drain pad area.

In the design 201 the problem of the cracks occurring at the superimposition between the layers M2 and M3 and in particular at the borders thereof, has been reduced or even completely resolved by removing this superimposition. This is achieved by designing isolated drain pads 205a, 205b, 205c, 205d. In this design the point where the failure was taking place does not exist anymore.

The design 201 shown in FIGS. 2A and 2D further comprises a drain bus bar 206. The drain bus bar 206 shorts the M2 drain fingers 204 and allows to measure better Ron during wafer testing by intentionally shorting all drain pads 205a, 205b, 206c, 206d together. In a wire-bonded packaging design the interconnection of the drain bus bar 206 is not required, since the design is as in FIG. 101.

As shown in FIG. 2D, in cascoded devices where a Si MOSFET works together with a GaN HEMT the best solution is to place the MOSFET on top of the HEMT. This way the parasitic inductance of the midnode is minimal and the performance of the cascode during switching operation is optimized. This configuration may comprise three different metal layers for drain and source interconnections. One of the metal layers (M2) is used for the device drain and source fingers and in order to connect the MOSFET on the source bus bars and isolating it from the drain bars another layer of metal (M3) is provided. This way a large source pad 202 can be provided, by which a good die bonding may be achieved. A series of vias 207 connect M2 to M3. On the drain pads M3 is not indispensable, but it is used in the wire bonded version to intentionally short all drain pads together, as explained above.

In accordance with the design 201 shown in FIGS. 2A and 2C-2D, one single drain pad is provided for each of section of the device (four in this case). The minimum distance between the M2 layer of the source bar and the M3 layer of the drain pad is preferably 20 μm.

Figure 3:
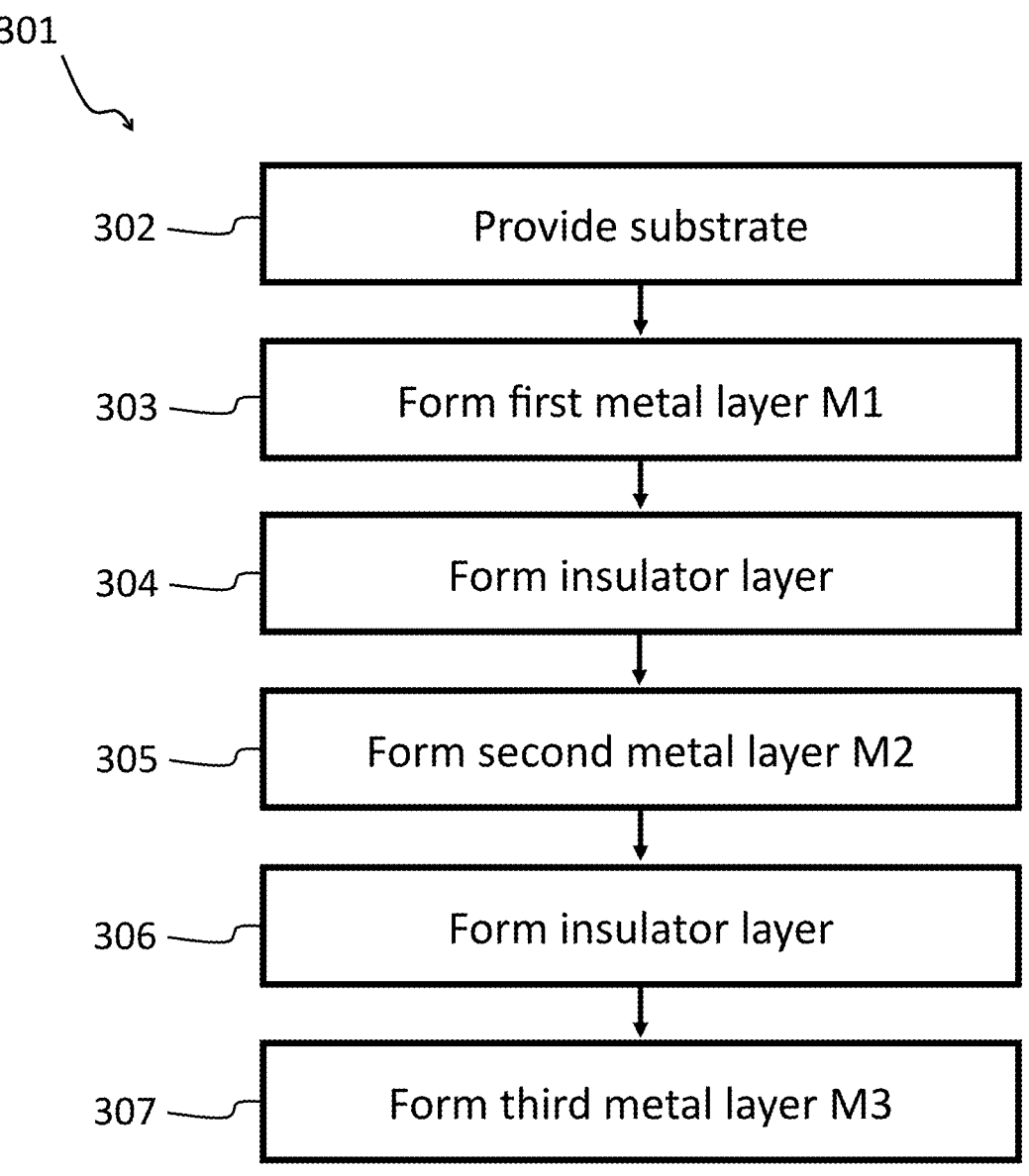
FIG. 3 shows a flow chart of a manufacturing process of a lateral power semiconductor in accordance with another aspect of the present disclosure.

FIG. 3 discloses a flow chart of a method 301 of manufacturing a lateral power semiconductor device 501, in accordance with any of the previous examples, wherein said method comprises the steps of:

providing 302 a semiconductor substrate, and forming semiconductor device thereon;

forming 303 a first metal layer (M1);

forming 304 an insulator layer on said first metal layer;

forming 305 a second metal layer (M2) on said insulator layer, said second metal layer comprising a plurality of conductive fingers, said conductive fingers comprising a plurality of parallel source fingers and parallel drain fingers isolated from said source fingers, wherein said drain fingers are interdigitated between said source fingers;

forming 306 an insulator layer on of said second metal layer;

forming a plurality of vias between said second metal layer (M2) and a third metal layer (M3), through said insulator layer;

forming 307 a said metal layer (M3) on said insulator layer, said third metal layer comprising a source pad area and a drain pad area;

and wherein said drain pad area comprises a plurality of drain pads, one for each of said plurality of drain fingers, wherein said plurality of drain pads are isolated from each other by a spacing corresponding to the position of said source fingers extending underneath said drain pad area.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

What is claimed is:

1. A lateral power semiconductor device, comprising:
a source pad area formed in a metal layer of the device;
a drain pad area spaced apart from the source pad area and formed in the metal layer of the device;
a plurality of conductive fingers formed in a further metal layer of the device, and comprising:
a plurality of parallel source fingers coupled to and extending from the source pad area towards and underneath the drain pad area, and
a plurality of parallel drain fingers isolated from the plurality of source fingers, and coupled to and extending from the drain pad area towards and underneath the source pad area, wherein the drain fingers are interdigitated between the source fingers, wherein the drain pad area comprises a plurality of drain pads, one for each of the plurality of drain fingers, and wherein the plurality of drain pads are isolated from each other by a spacing corresponding to the position of the source fingers extending underneath the drain pad area.

2. The lateral power semiconductor device according to claim 1, further comprising an insulator layer covering a perimeter edge of each of the drain pads.

3. The lateral power semiconductor device according to claim 2, further comprising contact pads corresponding in size to the drain pads, and wherein each of the contact pads in particular cover an area of the drain pad enclosed by an insulator layer on a perimeter edge of the respective drain pad.

4. The lateral power semiconductor device according to claim 2, wherein the semiconductor device is a high electron mobility transistor (HEMT).

5. The lateral power semiconductor device according to claim 2, further comprising:
an III-V layer comprising a semiconductor circuitry, wherein the III-V layer is a GaN layer.

6. The lateral power semiconductor device according to claim 2, wherein the source pad area and the drain pads are coupled to the plurality of conductive fingers by a plurality of corresponding vias.

7. The lateral power semiconductor device according to claim 2, wherein each of the plurality of parallel drain fingers are interconnected by a common drain bus bar, and wherein the common drain bus bar is formed in the metal layer.

8. The lateral power semiconductor device according to claim 2, wherein the source pad area and the drain pads are arranged for clip bonding packaging of the semiconductor device.

9. A cascoded semiconductor package comprising a Silicon MOSFET arranged on top of a GaN HEMT according to claim 2.

10. The lateral power semiconductor device according to claim 1, wherein the semiconductor device is a high electron mobility transistor (HEMT).

11. The lateral power semiconductor device according to claim 1, further comprising:
an III-V layer comprising a semiconductor circuitry, wherein the III-V layer is a GaN layer.

12. The lateral power semiconductor device according to claim 11, wherein the plurality of conductive fingers are formed by a second conductive layer, wherein the further metal layer is arranged on top of the III-V layer and isolated by an insulator layer in between the second conductive layer and the III-V layer.

13. The lateral power semiconductor device according to claim 12, wherein the source pad area and the drain pad area, are formed by a third conductive layer, wherein the third conductive layer is arranged on top of the second conductive layer and isolated by an insulator layer in between the third conductive layer and the second conductive layer.

14. The lateral power semiconductor device according to claim 13, wherein each of the drain pads further comprises a drain contact pad arranged on top of a corresponding drain pad, wherein the drain pads and the drain contact pads are isolated by an insulator layer in between the drain pads and the drain contact pads, and wherein the drain contact pads are comprised of a palladium covered metal layer.

15. The lateral power semiconductor device according to claim 1, wherein the source pad area and the plurality of drain pads are coupled to the plurality of conductive fingers by a plurality of corresponding vias.

16. The lateral power semiconductor device according to claim 1, wherein each of the plurality of parallel drain fingers are interconnected by a common drain bus bar, and wherein the common drain bus bar is formed in the metal layer.

17. The lateral power semiconductor device according to claim 1, wherein the source pad area and the drain pads are arranged for clip bonding packaging of the semiconductor device.

18. A cascoded semiconductor package comprising a Silicon MOSFET arranged on top of a GaN HEMT according to claim 1.

* * * * *